United States Patent [19]

Fassbender et al.

[11] Patent Number: 5,019,943
[45] Date of Patent: May 28, 1991

[54] HIGH DENSITY CHIP STACK HAVING A ZIGZAG-SHAPED FACE WHICH ACCOMMODATES CONNECTIONS BETWEEN CHIPS

[75] Inventors: Charles J. Fassbender, Poway; Jerry I. Tustaniwskyj, Mission Viejo; Harshadrai Vora, Poway, all of Calif.

[73] Assignee: Unisys Corporation, Blue Bell, Pa.

[21] Appl. No.: 479,791

[22] Filed: Feb. 14, 1990

[51] Int. Cl.$^5$ .............................................. H01L 23/04
[52] U.S. Cl. .................................... 361/396; 361/383; 361/386; 357/74
[58] Field of Search ............... 361/383, 386, 387, 388, 361/393, 395, 396, 400, 403, 404, 412, 415; 357/74, 75, 8 D; 439/68, 74, 75

[56] References Cited

U.S. PATENT DOCUMENTS

| | | | |
|---|---|---|---|
| 4,764,846 | 8/1988 | Go ........................................ | 361/388 |
| 4,894,706 | 1/1990 | Sato et al. ............................ | 357/75 |
| 4,941,033 | 7/1990 | Kishida ................................ | 357/74 |
| 4,969,827 | 11/1990 | Hahs, Jr. ............................. | 361/395 |

Primary Examiner—Leo P. Picard
Assistant Examiner—Young S. Whang
Attorney, Agent, or Firm—Charles J. Fassbender; Mark T. Starr

[57] ABSTRACT

A high density integrated circuit module is comprised of a plurality of integrated circuit chips; each of the chips has top and bottom surfaces and thin sides; and all of the chips are arranged in a stack in which the sides of the chips form multiple faces of the stack. Also, in accordance with the invention, a selected face of the stack has a zigzag shape which exposes a portion of the top surface of each chip on that face; and, bonding pads for carrying input/output signals to/from the chips are located on the exposed top surface portion of the chips. This zigzag shape is produced by (a) providing an indentation in the side of each of the chips which lie along the selected stack face; or (b) by offsetting the sides of the chps from each other as they lie along the selected stack face; or (c) by providing respective spacers between the chips and indenting them from the chips along the selected stack face.

17 Claims, 4 Drawing Sheets

HIGH DENSITY CHIP STACK HAVING A ZIGZAG-SHAPED FACE WHICH ACCOMMODATES CONNECTIONS BETWEEN CHIPS

BACKGROUND OF THE INVENTION

This invention relates to integrated circuit packages; and more particularly, it relates to high density integrated circuit modules in which a plurality of integrated circuit chips are stacked on top of one another.

In the prior art, a wide variety of integrated circuit packages have been described. See, for example, U.S Pat. Nos. 4,643,935 and 4,807,019. In the former, only a single integrated circuit chip is contained in the package; while in the latter, multiple integrated circuit chips are contained in the package. However, in the '019 multichip package, the chips are not stacked on top of one another; instead they lie side by side in a plane. Thus, the chip packaging density of the package is substantially lower than that of a chip stack.

In the prior art, a chip stack is described in U.S. Pat. No. 4,525,921. There, the stacked chips are indicated by reference numeral 14 in FIG. 2. Each of the chips contains integrated circuits, and input/output signals to/from those circuits are carried by microscopic conductors 68 to one face of the stack.

All of the microscopic conductors 68 are inherently thin and fragile since they are formed as part of the integrated circuitry that is on the chips. Typically, conductors that are formed within an integrated circuit are only about 1 um to 4 um wide and 0.1 um to 0.2 um thick. This then presents the problem of how to interconnect the ends of the conductors 68 from all of the chips along the face of the stack.

In particular, it is not possible to interconnect the ends of the conductors 68 by simply: (a) depositing an insulating layer over the face of the stack to which they run, (b) opening via holes in that insulating layer which exposes just the ends of the conductors, and (c) patterning interconnecting conductors on the insulating layer and in the via holes. Such via holes would expose both the ends of the conductors 68 and a portion of the sides of the chips. Thus, the interconnecting conductors which are formed in the via holes will also be shorted to the sides of the chips.

To overcome the above problem, patent '921 discloses a four-step process by which the conductors 68 can be interconnected without producing shorts to the sides of the chips. These steps are illustrated in FIGS. 5A–5D; and they consist of lapping, etching, passivating, and re-lapping the face of the chip stack to which the conductors 68 extend.

However, those four steps add to the overall complexity and cost of the manufacturing the stack. Also, after the etching step, the thin, fragile conductors 68 protrude from the face of the stack; so they can easily be bent or broken. If any of the protruding conductors 68 are bent, they will "shadow" the adjoining silicon chip during the passivation step and thereby cause a void in the passivation layer. Such a void will cause a short circuit to the side of the chip when metallization for interconnecting the I/O conductors 68 is subsequently applied.

Accordingly, a primary object of the invention is to provide an improved architecture for a stack of integrated circuit chips in which all of the above problems are avoided.

BRIEF SUMMARY OF THE INVENTION

A high density integrated circuit module is comprised of a plurality of integrated circuit chips; each of the chips has top and bottom surfaces and thin sides; and all of the chips are arranged in a stack in which the sides of the chips form multiple faces of the stack. Also, in accordance with the invention, a selected face of the stack has a zigzag shape which exposes a portion of the top surface of each chip on that face; and, bonding pads for carrying input/output signals to/from the chips are located on the exposed top surface portion of the chips. This zigzag shape is produced by providing an indentation in the side of each of the chips which lie along the selected stack face. Alternatively, the zigzag shape is formed by offsetting the sides of the chips from each other as they lie along the selected stack face. As another alternative, the zigzag shape is formed by providing respective spacers between the chips and indenting them from the chips along the selected stack face.

BRIEF DESCRIPTION OF THE DRAWINGS

Various features and advantages of the present invention are described herein in conjunction with the accompanying drawings wherein.

DETAILED DESCRIPTION OF THE INVENTION

Figure 2:
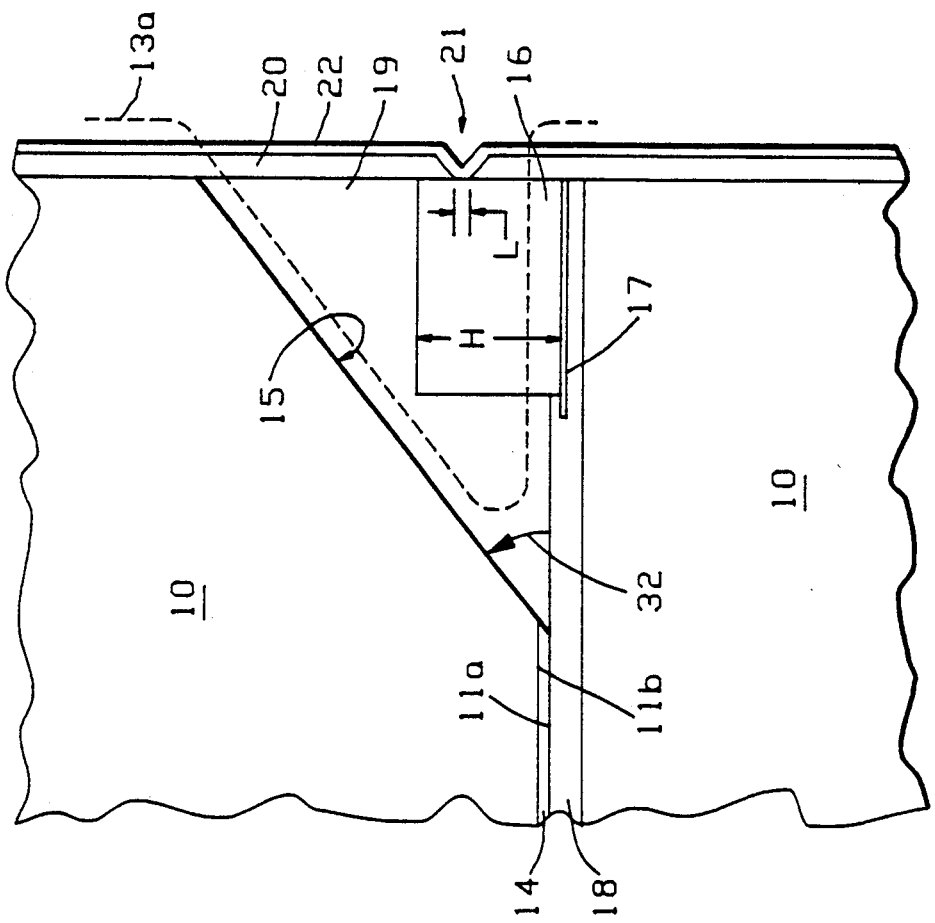
FIG. 2 is a further enlargement of a portion of the FIG. 1 embodiment.
Figure 1:
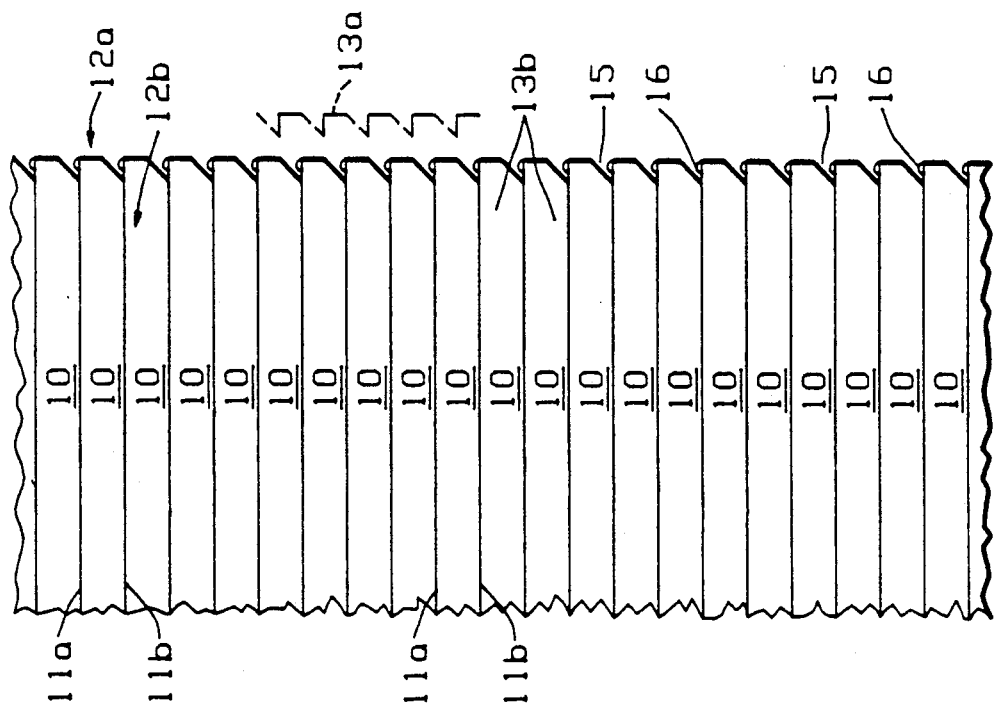
FIG. 1 is an enlarged view of a portion of a high density integrated circuit module that is constructed in accordance with one embodiment of the invention.

Referring now to FIGS. 1 and 2, a preferred embodiment of the invention will be described in detail. In those figures, reference numeral 10 indicates respective semiconductor chips. Each of the chips has a top surface 11a, a bottom surface 11b, and four sides— two of which can be seen in the drawings as 12a and 12b. All of the chips are arranged in a stack 13, and they are held in place by an electrically insulative adhesive 14 which lies between the surfaces 11a and 11b. One face 13a of the stack is formed by the chip sides 12a; another face 13b of the stack is formed by the chip sides 12b; etc.

To help illustrate the key features of the invention, the chips 10 in FIGS. 1 and 2 are drawn much larger than their actual size. Surfaces 11a and 11b of the chips 10 range from 2 mm to 20 mm on a side, and the thickness of the chips 10 ranges from 0.2 mm to 1.0 mm. Thus in FIG. 1, the chips 10 are enlarged by a factor of about ten; while in FIG. 2, the chips 10 are enlarged by a factor of about two hundred.

All of the chip sides 12a that lie along the stack face 13a have an indentation 15. These indentations 15 give the stack face 13a a zigzag shape; and the indentation 15 on any one chip in the stack exposes a portion of the top surface 11a of the next adjacent chip. Integrated onto the exposed top surface portion of each chip is a row of conductive bumps 16. Only one bump per chip can be seen in FIGS. 1 and 2 because the bumps 16 lie behind one another perpendicular to the plane of those figures. Typically there are twenty to one hundred bumps per chip. Each bump 16 connects to a bonding pad 17 on the exposed portion of top surface 11a, and those pads 17 carry input/output signals to/from various circuitry (not shown) that is integrated into the chip. Such circuitry is formed in any conventional fashion in a region 18 near the chip's top surface.

Each of the bumps 16 has a certain height "H" perpendicular to the bonding pad 17. That height H is controlled such that the bump 16 terminates before touching the indentation 15 of the side 12a of the overlying chip. Due to this constraint, adjacent chips are not shorted together.

All of the space between a bump 16 and the overlying chip indentation 15 is filled with an electrical insulator 19. Also, an electrical insulating layer 20 covers the cube face 13a. Suitably, the insulator 19 is made of the same material as the adhesive 14 or a polyimide; and the insulator 20 suitably is made of a polyimide or silicon nitride. A plurality of via holes 21 are formed in the insulating layer 20, and they expose respective portions of the bumps 16 along the cube's face 13a. Electrical conductors 22 lie on the insulating layer 20 and selectively interconnect the bumps 16 of the various chips through the via holes 21.

As FIG. 2 illustrates, the height H of each bump 16 is several times larger than the length L of each via hole 21. This enables the exact location of a via hole 21 to vary along a bump 16 perpendicular to the chip's top surface 11a and still expose just the bump 16. Such variations are inherent when the FIG. 1-2 structure is made in a mass production environment in which the spacing of the via holes 21 between chips is fixed by a via hole mask, while the alignment of the mask as well as the spacing of the bumps 16 between chips varies with certain manufacturing tolerances.

Preferably, the height H of the bump is in the range of 20 um to 100 um, and the length L of via hole 20 is ¼ to 1/20 the height of the bump. If the bump 16 is made much smaller than 20 um, then the risk of having the via hole 21 expose a portion of the underlying chip side 12a, due to alignment variations, becomes too high. Such an exposure must be avoided because it would cause the conductor 22 to short to the chip side 12a. Also, to accommodate alignment variations of the via hole mask parallel to the chip's top surface 11a, the bumps 16 preferably are several times wider than the via holes in that direction.

To fabricate the FIG. 1-2 structure, one can proceed as follows. Initially, all of the integrated circuitry in region 18 and the bonding pads 17 are built by any conventional IC chip fabrication process. Thereafter, all of the bumps 16 are fabricated on the chips 10 before those chips are cut from their semiconductor wafer. This is achieved by depositing a layer of polyimide over the wafer, opening holes in the polyimide over the bonding pads 17 where the bumps 16 are to be formed, sputtering a thin seed layer of an electroplateable conductor (e.g., copper or nickel) on the polyimide and the exposed bonding pads, covering the seed layer with a layer of photoresist except over the bonding pads, and electroplating a suitable conductor (e.g., nickel or copper or gold) on top of the seed layer to the desired final thickness of the bumps 16. Thereafter, the photoresist and underlying seed layer are removed.

Figure 3:
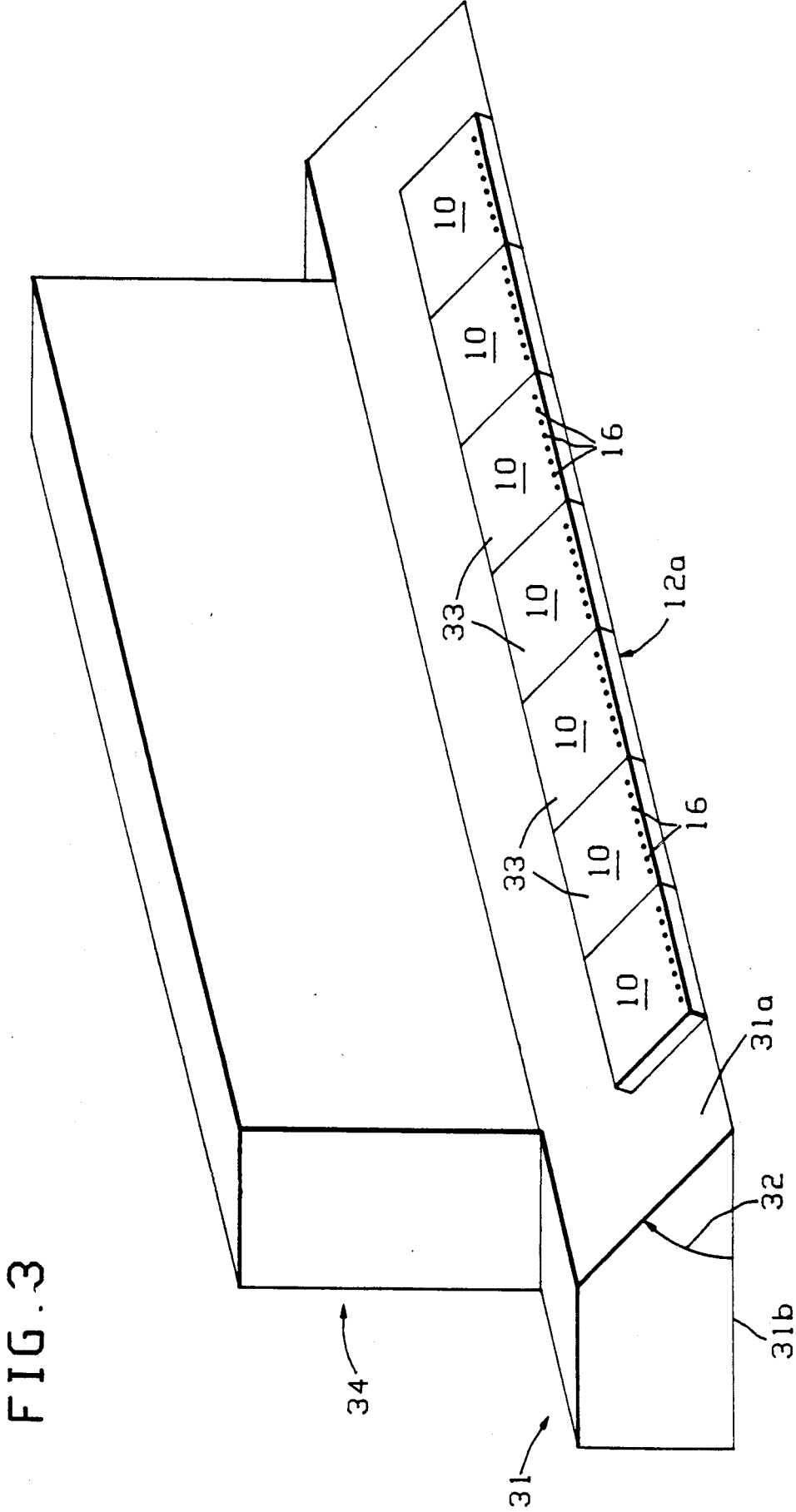
FIG. 3 shows an apparatus for producing the high density module of FIGS. 1 and 2.

Subsequently, strips of adjacent chips are cut from the wafer, and the indentations 15 are formed in the chip sides 12. FIG. 3 shows a part holder 31 which is used to make these indentations. Part holder 31 is made of a soft material that is easily lappable such as aluminum, and it has two smooth faces 31a and 31b that intersect at an acute angle 32 which equals the desired angle of the indentation 15 (see FIG. 2). Lying on the face 31a is a strip 33 of several of the semiconductor chips 10 which was cut from the semiconductor wafer after all of the integrated circuitry and the bumps 16 were formed on the wafer.

Strip 33 is removably attached to the face 311a by a thermoplastic adhesive such as beeswax. Following this attachment, face 31b of the part holder 31 is lapped by a flat lapping wheel (not shown) which rotates against surface 31b in a horizontal plane. As that occurs, an edge of the strip 33 is also lapped to thereby form the indentation 15 on all of the chip surfaces 12a. To control the rate at which this indentation is made, a weight 34 can be placed on the part holder 31. After the indentation 15 is made, the strip 33 is removed and the individual chips 10 are cut from it.

After the indentations 15 are made, the chips 10 are stacked together. To do that, the chips 10 are stacked one at a time; or alternatively, all of the chips 10 are stacked simultaneously in a fixture. During this stacking step, the adhesive 14 can be squeezed out from between the chips to fill the indentations 15. Alternatively, the indentations 15 can be filled, using a subsequent separate step, with a separate insulator such as polyimide. Thereafter, face 13a of the chip stack 13 is lapped until the insulator 19 and the bumps 16 lie flush with the chip sides 12a. Subsequently, the insulating layer 20 is deposited on face 13a of the chip stack; the via holes 21 are opened; and the conductors 22 are patterned on the insulator 20 such that they selectively interconnect the bumps 16 on all of the chips.

Figure 5:
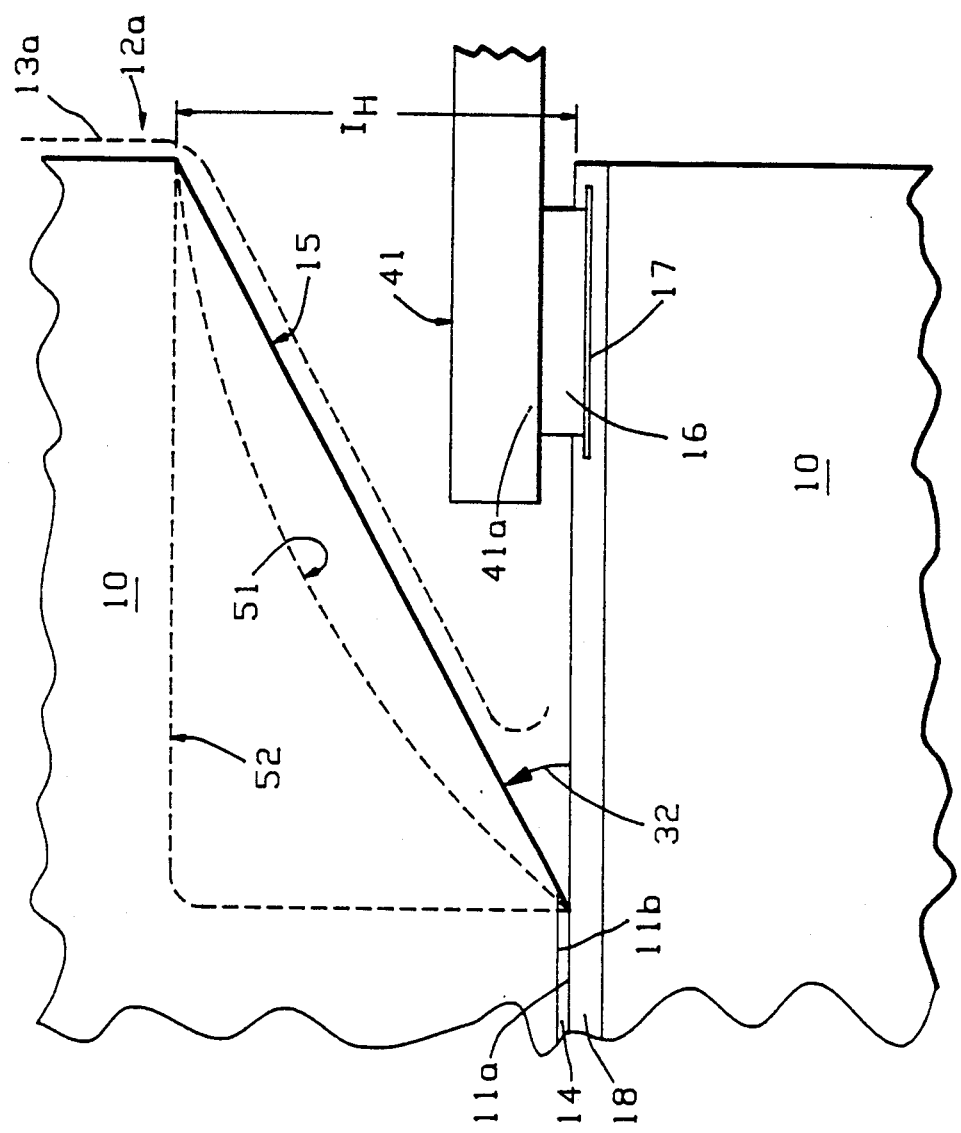
FIG. 5 is a further enlargement of a portion of the second embodiment.
Figure 4:
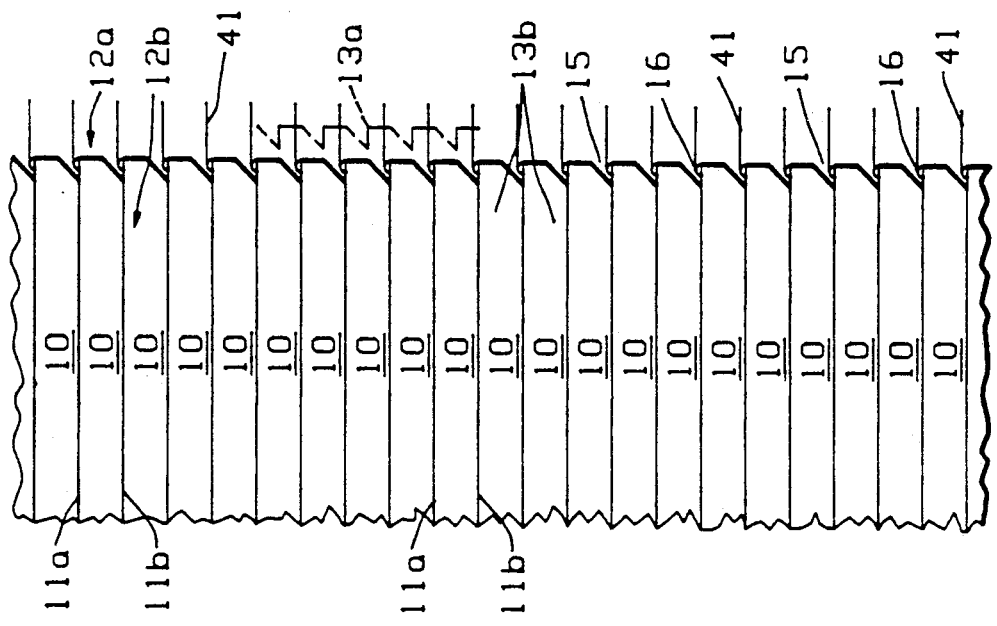
FIG. 4 is an enlarged view of a second embodiment of a high density integrated circuit module that is constructed according to the invention.

Turning now to FIGS. 4 and 5, a second preferred embodiment of the invention will be described. This embodiment has certain similarities with the embodiment of FIGS. 1 and 2; and like structural features are indicated by like reference numerals. In the embodiment of FIGS. 4 and 5, the primary different feature is that it includes a plurality of discrete input/output leads 41 that are bonded at one end 41a to a respective bump 16, and the remainder of each I/O lead extends in a cantilevered fashion away from and perpendicular to the cube face 13a. All of the bonds at the ends 41a are made after the indentations 15 are formed on the chips 10 but before the chips 10 are stacked together. After the stacking is complete, the cantilevered ends of the I/O leads 41 are soldered to a substrate (such as the substrate 61 in FIGS. 6 and 7) which electrically interconnects the I/O leads 41 in any desired pattern.

As one specific example of some practical dimensions for this embodiment, each of the bumps 16 can be 25 um high, 100 um long, and 100 um wide; while each of the I/O leads 41 can be 50 um high, 600 um long, and 125 um wide. Using such dimensions, the indentations 15 will readily clear the I/O leads 41 when angle 32 is made 30° and the indentation's height $I_H$ along the cube face 13a is just 250 um. Also, with such dimensions, the I/O leads 41 are strong enough to support the weight of the chip stack and withstand handling.

Preferably, after the I/O leads 41 are bonded to the bumps 16 along the chip side 12a, these leads 41 are cut to a precise length with respect to that chip's opposite side. This causes the cut ends of the leads 41 on all of the chips to terminate in a single plane when those chips are stacked together such that the sides opposite 12a are flush and aligned. Having the cut ends of the leads 41 all terminate in a single plane ensures that the weight of the chip stack is evenly distributed among the leads 41 when the cut ends are soldered onto the interconnect substrate 61.

Additional space for the I/O leads 41 and/or the bumps 16 in both the above-described embodiments can be obtained by shaping the indentation 15 as either a curved bevel or a rectangular notch. These two shapes are respectively indicated by reference numerals 51 and 52 in FIG. 5. To make the curved bevel 51, the edge of the chips that is to be indented is held against a cylindrical lapping wheel whose radius equals the desired curvature 51. To make the rectangular notch 52, a slice of chips 33 or a complete wafer is etched partway through from its bottom surface 11b in the streets which separate the chips; and thereafter, the chips are separated by a top surface cut which is narrower than the bottom surface etch by the desired depth of the notch.

Figure 7:
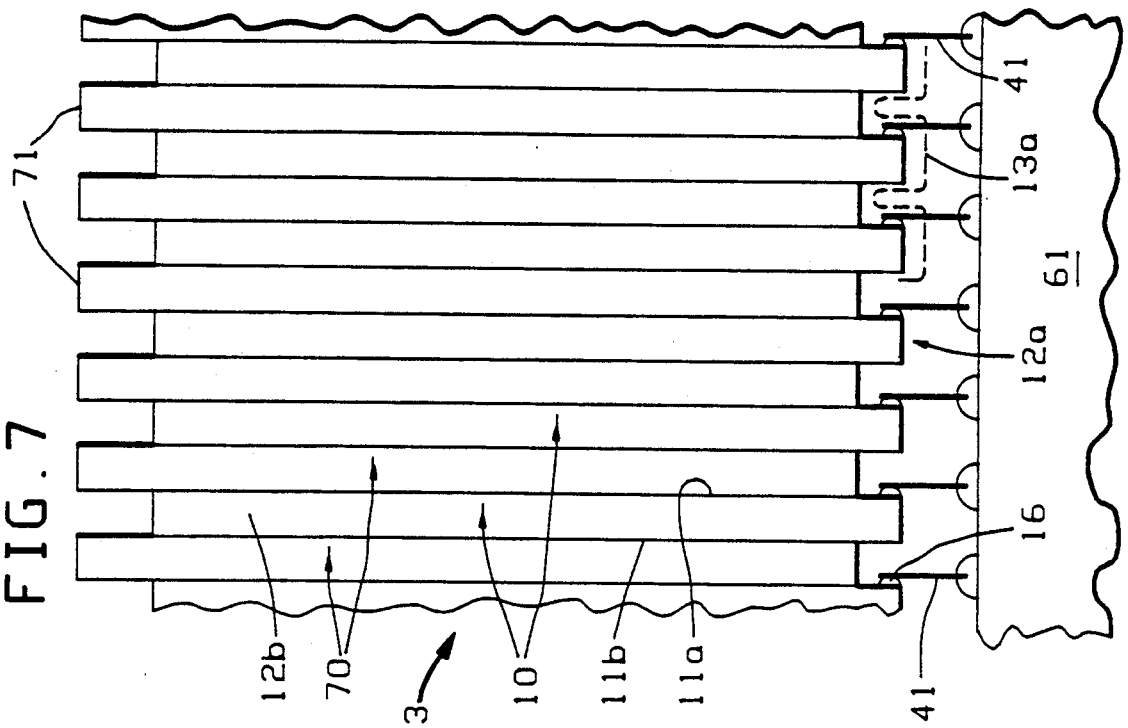
Figure 6:
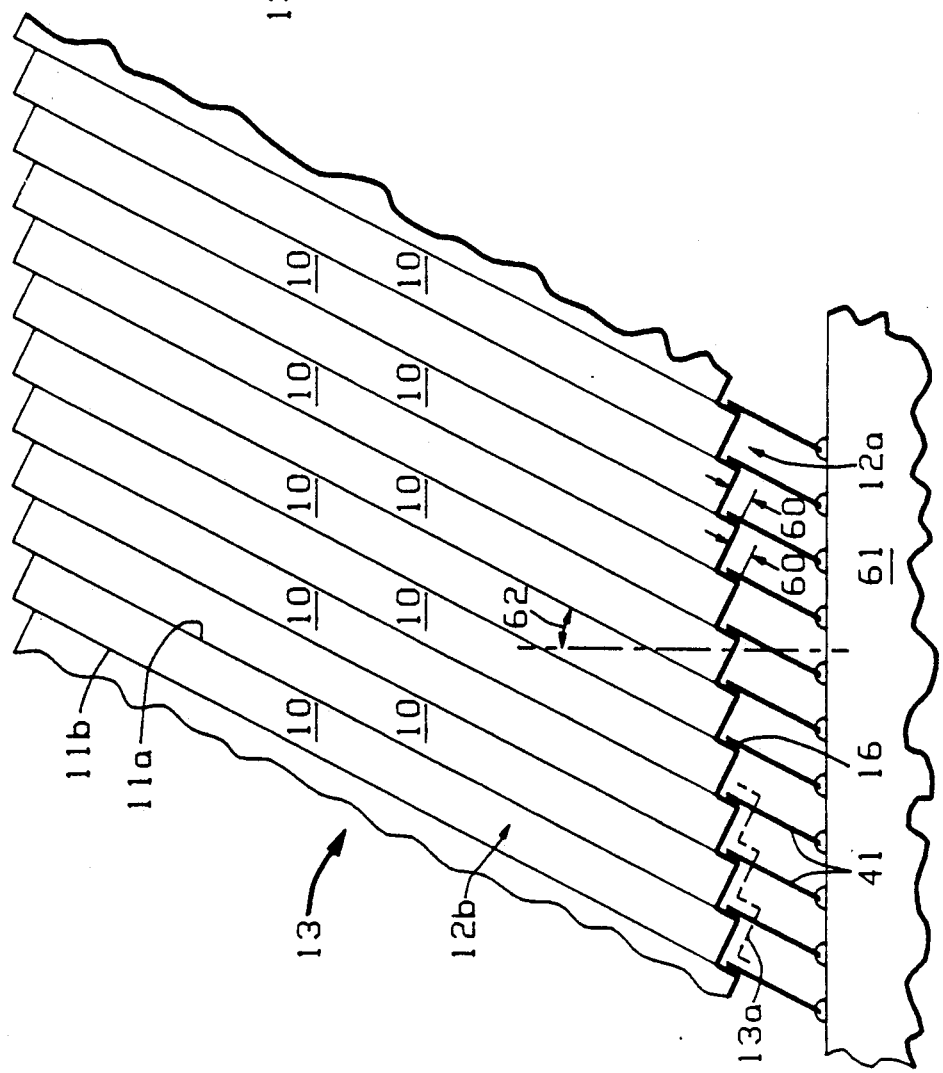
FIG. 6 is an enlarged view of a third embodiment of a high density integrated circuit module that is constructed according to the invention; and, FIG. 7 is an enlarged view of a fourth embodiment of a high density integrated circuit module that is constructed according to the invention.

Turning now to FIGS. 6 and 7, two additional preferred embodiments of the invention will be described. In those figures, components and features which are similar to the previously described embodiments are again indicated by like reference numerals. In the embodiments of FIGS. 6 and 7, the primary different feature is that none of the chip sides 12a, 12b, . . . is indented. Instead, in the FIG. 6 embodiment, the chip sides 12a are offset from one chip to the next as indicated by reference numeral 60. This offset gives the stack face 13a a zigzag shape which exposes the bonding pads 17 and makes room for the bumps 16 and the I/O leads 41. In the FIG. 7 embodiment, the chips are separated by respective spacers 70 which are offset from the chip sides 12a. These spacers 70 give the stack face 13a a zigzag shape, expose the bonding pads 17, and make room for the bumps 16 and the I/O leads 41.

In both the FIG. 6 and 7 embodiments (as well as the FIG. 4–5 embodiment) the cantilevered ends of the I/O leads 41 are soldered to a multilayer substrate 61 which selectively interconnects those conductors. One suitable substrate is described in U.S. Pat. No. 4,721,831. Due to the offset 60 in the FIG. 6 embodiment, the chips 10 are not perpendicular to the soldering surface of substrate 61; but instead, they lean at an acute angle 62. By keeping the indentation 60 less than the chips' thickness, the lean angle 62 is kept below 45°. With the FIG. 7 embodiment, the chips 10 lie perpendicular to the soldering surface of substrates 61.

All of the spacers 70 in the FIG. 7 embodiment extend beyond the chips 10 along any one of their sides other than side 12a. This enables the spacers 70 to function as cooling fins 71 for the chips 10 and thereby remove heat from the central portion of the stack 13. Thus the stack 10 in the FIG. 7 embodiment can have a higher power dissipation than the other described embodiments. Preferably, the spacers 70 and the chips 10 have thermal coefficients of expansion which are substantially similar in order to prevent the stack 13 from cracking when its power dissipation and corresponding thermal expansion is high. This is achieved by making the spacers 70 of the same material as the chips 10 (e.g., silicon) or by making the spacers 70 of aluminum nitride.

Various preferred embodiments of the invention have now been described in detail. In addition, however, many changes and modifications can be made to these embodiments without departing from the nature and the spirit of the invention. For example, the spacers 70 in the FIG. 7 embodiment need not extend past the chips 10 if the fins 71 are not required to cool the chips. Also, the bumps 16 in the FIG. 1–2 embodiment can be fabricated as "posts" using laser assisted chemical vapor deposition as is described in U.S. Pat. No. 4,845,542. Thus the term "bumps" as used herein is defined to include such "posts". Further, input/output terminals, such as solder bumps, can be fabricated on portions of the conductors 20 of the FIG. 1–2 embodiment to enable that chip stack to be interconnected to the substrate 61. Accordingly, it is to be understood that the invention is not limited to the illustrated details but is defined by the appended claims.

What is claimed is:

1. A high density integrated circuit module that is comprised of a plurality of integrated circuit chips; each of said chips having top and bottom surfaces and thin sides; and all of said chips being arranged in a stack in which the sides of said chips form multiple faces of said stack; wherein:
   one face of said stack has a zigzag shape which exposes a portion of the top surface of each chip on said one face; and,
   bonding pads, for carrying input/output signals to/from said chips, are located on the exposed top surface portions of said chips.

2. A module according to claim 1 wherein each side of said chips along said one face of said stack has an indentation which produces said zigzag shape and exposes said portion of the top surface of the next adjacent chip.

3. A module according to claim 2 wherein conductive bumps lie on and extend perpendicular to said bonding pads, and wherein said bumps terminate without touching said indented chip side.

4. A module according to claim 3 wherein an electrical insulator covers said one face of said stack except for a plurality of via holes which expose respective portions of said bumps on said one face, and patterned electrical conductors lie on said insulator and interconnect said chips through said via holes.

5. A module according to claim 3 wherein a plurality of input/output leads respectively extend from said bumps in a cantilevered fashion in a direction away from said one face without touching said indented chip's side.

6. A module according to claim 2 wherein said indentation is in the form of a flat bevel.

7. A module according to claim 2 wherein said indentation is in the form of a curved bevel.

8. A module according to claim 2 wherein said indentation is in the form of a rectangular notch.

9. A module according to claim 1 wherein each chip in said stack is offset from the next adjacent chip, along said one face, to produce said zigzag shape and expose said portion of the top surface of the next adjacent chip.

10. A module according to claim 9 wherein conductive bumps lie on and extend perpendicular to said bonding pads, and wherein a plurality of input/output leads respectively extend from said bumps in a cantilevered fashion in a direction away from said zigzag-shaped face.

11. A module according to claim 10 wherein said stack is mounted by said leads to a surface of a substrate such that the top and bottom surfaces of said chips lean and are not perpendicular to the substrate surface.

12. A module according to claim 11 wherein the amount of said lean is less than 45°.

13. A module according to claim 1 wherein respective spacers lie between said chips; and, said spacers are indented from said chips, along said one face, to produce said zigzag shape and expose said portion of the top surface of the next adjacent chip.

14. A module according to claim 13 wherein conductive bumps lie on and extend perpendicular to said bonding pads, and wherein a plurality of input/output leads respectively extend from said bumps in a cantilevered fashion in a direction away from said zigzag-shaped face.

15. A module according to claim 14 wherein said stack has a second face which lies opposite to said one face, and said spacers form cooling fins by extending beyond said chips on said second face.

16. A module according to claim 14 wherein said stack has a second face which lies perpendicular to said one face, and said spacers form cooling fins by extending beyond said chips on said second face.

17. A module according to claim 14 wherein said spacers and said chips have respective thermal expansion coefficients which are essentially the same.

* * * * *